(12) United States Patent
Horikawa et al.

(10) Patent No.: US 6,504,436 B2
(45) Date of Patent: Jan. 7, 2003

(54) TRANSCONDUCTANCE TUNING CIRCUIT WITH INDEPENDENT FREQUENCY AND AMPLITUDE CONTROL

(75) Inventors: Akira Horikawa, Chiba (JP); Akira Yoshida, Chiba (JP); Takashi Taya, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 36 days.

(21) Appl. No.: 09/862,505

(22) Filed: May 23, 2001

(65) Prior Publication Data

US 2002/0000885 A1 Jan. 3, 2002

(30) Foreign Application Priority Data

May 30, 2000 (JP) .......................... 2000-164774

(51) Int. Cl.[7] .................... H03L 7/08; H03L 7/099; H03B 5/26
(52) U.S. Cl. ..................... 331/11; 331/8; 331/138; 331/140; 331/141; 331/177 R; 331/183
(58) Field of Search ................... 331/8, 10, 11, 331/15, 18, 25, 109, 110, 138–142, 175, 177 R, 182, 183

(56) References Cited

U.S. PATENT DOCUMENTS 4,145,670 A  3/1979  Bode
5,767,748 A  6/1998  Nakao
6,323,738 B1 * 11/2001  Yoshizawa et al. ........... 331/57

FOREIGN PATENT DOCUMENTS

EP  0 453 039 A1  10/1991
EP  0 455 298 A1  11/1991

OTHER PUBLICATIONS

IEEE Journal of Solid–State Circuits, vol. 27, No. 2, Feb. 1992, pp. 142–153, Nauta, B. "A CMOS Transconductance–C Filter Technique for Very High Frequencies".

* cited by examiner

Primary Examiner—David C. Mis
(74) Attorney, Agent, or Firm—Venable; Michael A. Sartori

(57) ABSTRACT

A tuning circuit includes an oscillator that receives an oscillating input signal and a control signal, and generates an oscillating output signal. The control signal is obtained from a frequency control circuit that compares the phases of the oscillating output signal and a reference signal. The control signal controls the transconductance of a transconductance element in the oscillator, thereby controlling the oscillator output frequency. The oscillating input signal is obtained from an amplitude control circuit that detects an amplitude limit of the oscillator output. The oscillator output amplitude is responsive to the oscillating input signal. Frequency control and amplitude control in this tuning circuit are mutually independent, so their respective control loops remain stable under all frequency and amplitude combinations.

7 Claims, 5 Drawing Sheets

TRANSCONDUCTANCE TUNING CIRCUIT WITH INDEPENDENT FREQUENCY AND AMPLITUDE CONTROL

BACKGROUND OF THE INVENTION

The present invention relates to a tuning circuit suitable for use in, for example, radio communication equipment.

Tuning circuits in radio communication equipment often include a voltage-controlled oscillator (VCO) controlled by a phase-locked loop (PLL). The tuning circuit may also include a filter such as a low-pass filter or bandpass filter. The tuning operations include tuning of the oscillation frequency and quality factor of the VCO, and tuning of the cutoff frequency and quality factor of the filter. Frequency tuning will also be referred to below as f-tuning, and quality-factor turning will be referred to as Q-tuning.

Tuning circuits that can be realized as complementary metal-oxide-semiconductor (CMOS) integrated circuits are desirable for miniaturization and economy. One such circuit is described by Bram Nauta in "A CMOS Transconductance-C Filter Technique for Very High Frequencies," IEEE Journal of Solid-State Circuits, Vol. 27, No. 2, 1992. The VCO and filter in this circuit employ transconductance elements with variable transconductance values. The transconductance values are controlled by means of two power-supply voltages that are supplied to each transconductance element. One power-supply voltage is controlled for f-tuning by a PLL that compares the frequency and phase of the VCO output with the frequency and phase of a reference clock signal; the other power-supply voltage is controlled for Q-tuning by a loop that detects the amplitude of the VCO output and compares the amplitude with a reference voltage. These loops tune the frequency and quality factor of the VCO so that the VCO oscillates with the desired frequency and amplitude. The filter is tuned by copying the power-supply voltages supplied to the VCO.

This tuning circuit has excellent high-frequency characteristics, and also includes a temperature compensation function. However, although the Q-tuning control loop operates much faster than the f-tuning control loop, the two loops are not completely independent, and there remains a risk of unstable operation for certain combinations of the tuning parameters.

SUMMARY OF THE INVENTION

An object of the present invention is to provide a tuning circuit, using a transconductance element, that remains stable when tuned by feedback control with respect to both frequency and amplitude simultaneously.

The invented tuning circuit includes an oscillator, a frequency control circuit, and an amplitude control circuit.

The oscillator receives an oscillating input signal and a control signal, and generates an oscillating output signal. The frequency of the oscillating output signal is determined by the transconductance of a transconductance element in the oscillator. This transconductance is controlled by the control signal. The amplitude of the oscillating output signal is responsive to the oscillating input signal.

The frequency control circuit detects the phase difference between the oscillating output signal and a reference signal, and generates the above-mentioned control signal.

The amplitude control circuit detects an amplitude limit of the oscillating output signal, and generates the oscillating input signal according to the detected amplitude limit, by amplifying the oscillating output signal with a gain responsive to the detected amplitude limit, for example.

In the invented tuning circuit, control of the frequency of the oscillating output signal is completely independent of control of the amplitude of the oscillating output signal, so the respective control loops are stable under all combinations of the frequency and amplitude control parameters.

DETAILED DESCRIPTION OF THE INVENTION

Figure 1:
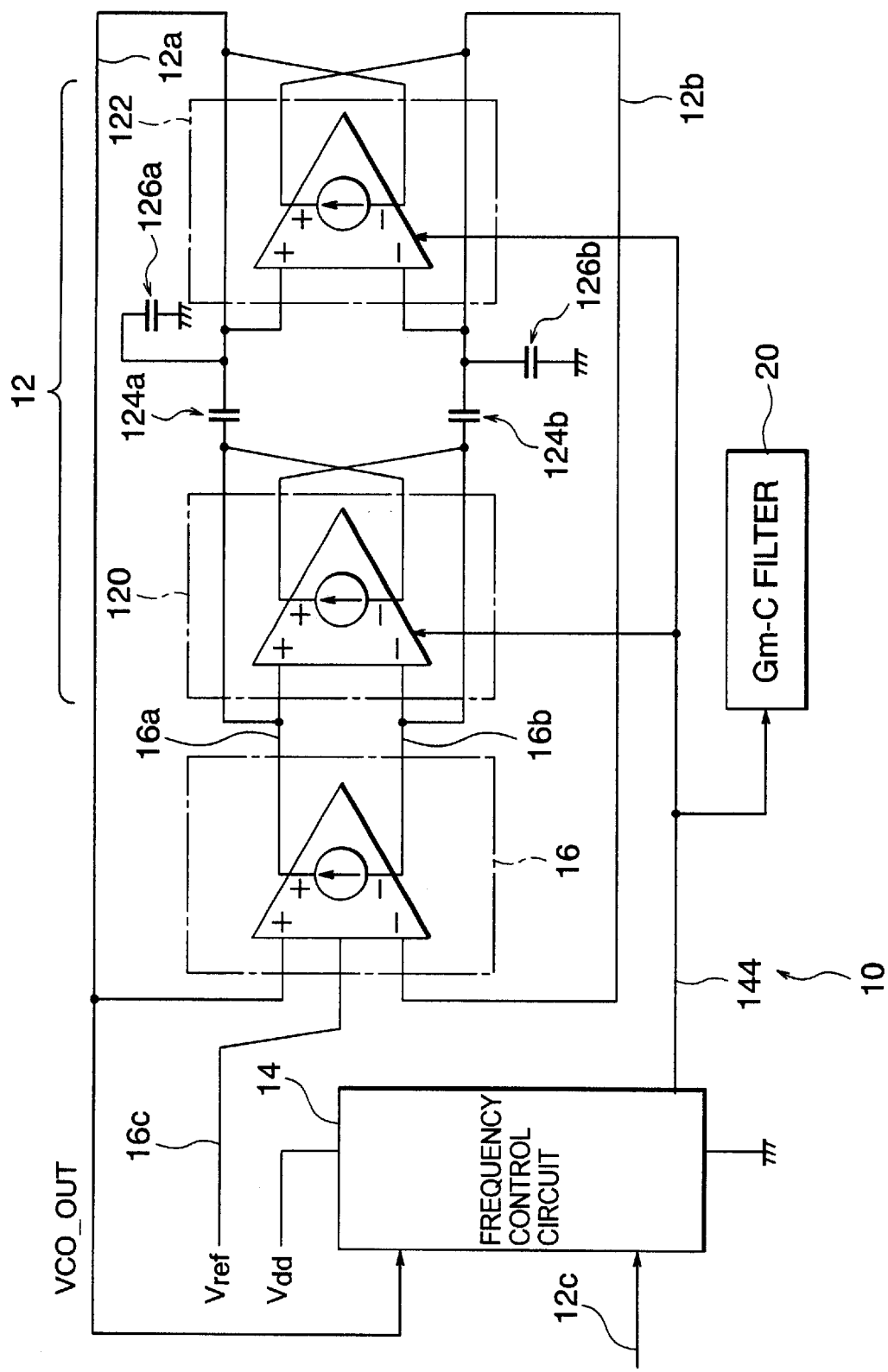
FIG. 1 is a block diagram of a tuning circuit embodying the invention.

A tuning circuit embodying the present invention will now be described with reference to the attached drawings, in which like parts are indicated by like reference characters.

Referring to FIG. 1, the tuning circuit includes an oscillating circuit 10 comprising a VCO 12, a frequency control circuit 14, and an amplitude control circuit 16, and a Gm-C filter 20 having a cutoff frequency slaved to the frequency of the VCO 12.

The VCO 12, which is based on a Wien bridge, has two differential transconductance amplifiers 120, 122 and two pairs of capacitors 124a, 124b, 126a, 126b. The differential transconductance amplifiers will also be referred to below as Gm cells.

The non-inverting (+) input terminal of Gm cell 120 is connected to the non-inverting (+) output terminal of the amplitude adjustment circuit 16 and the inverting (−) output terminal of Gm cell 120, and is capacitively coupled through capacitor 124a to the inverting (−) output terminal of Gm cell 122. The inverting (−) input terminal of Gm cell 120 is connected to the inverting (−) output terminal of the amplitude adjustment circuit 16 and the non-inverting (+) output terminal of Gm cell 120, and is capacitively coupled through capacitor 124b to the non-inverting (+) output terminal of Gm cell 122.

The non-inverting (+) input terminal of Gm cell 122 is connected to the inverting (−) output terminal of Gm cell 122, is capacitively coupled through capacitor 124a to the inverting (−) output terminal of Gm cell 120, and is capacitively coupled through capacitor 126a to ground. The inverting (−) input terminal of Gm cell 122 is connected to the non-inverting (+) output terminal of Gm cell 122, is capacitively coupled through capacitor 124b to the non-inverting (+) output terminal of Gm cell 120, and is capacitively coupled through capacitor 126b to ground.

The output signals of the VCO 12 are the differential output signals 12a, 12b of Gm cell 122. These signals are fed back to the frequency control circuit 14 and amplitude control circuit 16 as follows. The output signal 12b from the non-inverting (+) output terminal of Gm cell 122 is supplied to the inverting (−) input terminal of the amplitude control circuit 16. The output signal 12a from inverting (−) output terminal of Gm cell 122 (VCO_OUT) is supplied to the non-inverting (+) input terminal of the amplitude adjustment circuit 16, and to an input terminal of the frequency control circuit 14.

The frequency control circuit 14 also receives a reference clock signal 12c, and generates a frequency control signal 144. The reference clock signal 12c is generated by, for example, a master VCO (not shown). The frequency control signal 144 is a voltage signal that adjusts the transconductance values of the Gm cells 120, 122 and controls the filter characteristic of the Gm-C filter 20.

The amplitude control circuit 16 also receives a reference voltage signal 16c ($V_{ref}$) indicating the desired amplitude level of the VCO output.

The input signals of the VCO 12 are the frequency control signal 144 received from the frequency control circuit 14, and a pair of differential input signals 16a, 16b received by Gm cell 120 from the amplitude control circuit 16. These differential input signals 16a, 16b, like the differential output signals 12a, 12b of the VCO 12, are oscillating signals.

The Gm-C filter 20 includes at least one transconductance element (not visible) with a transconductance value (Gm) controlled by the same frequency control signal 144 that controls the transconductance values of the Gm cells 120, 122 in the VCO 12, and at least one load capacitor (C, not visible).

Figure 2:
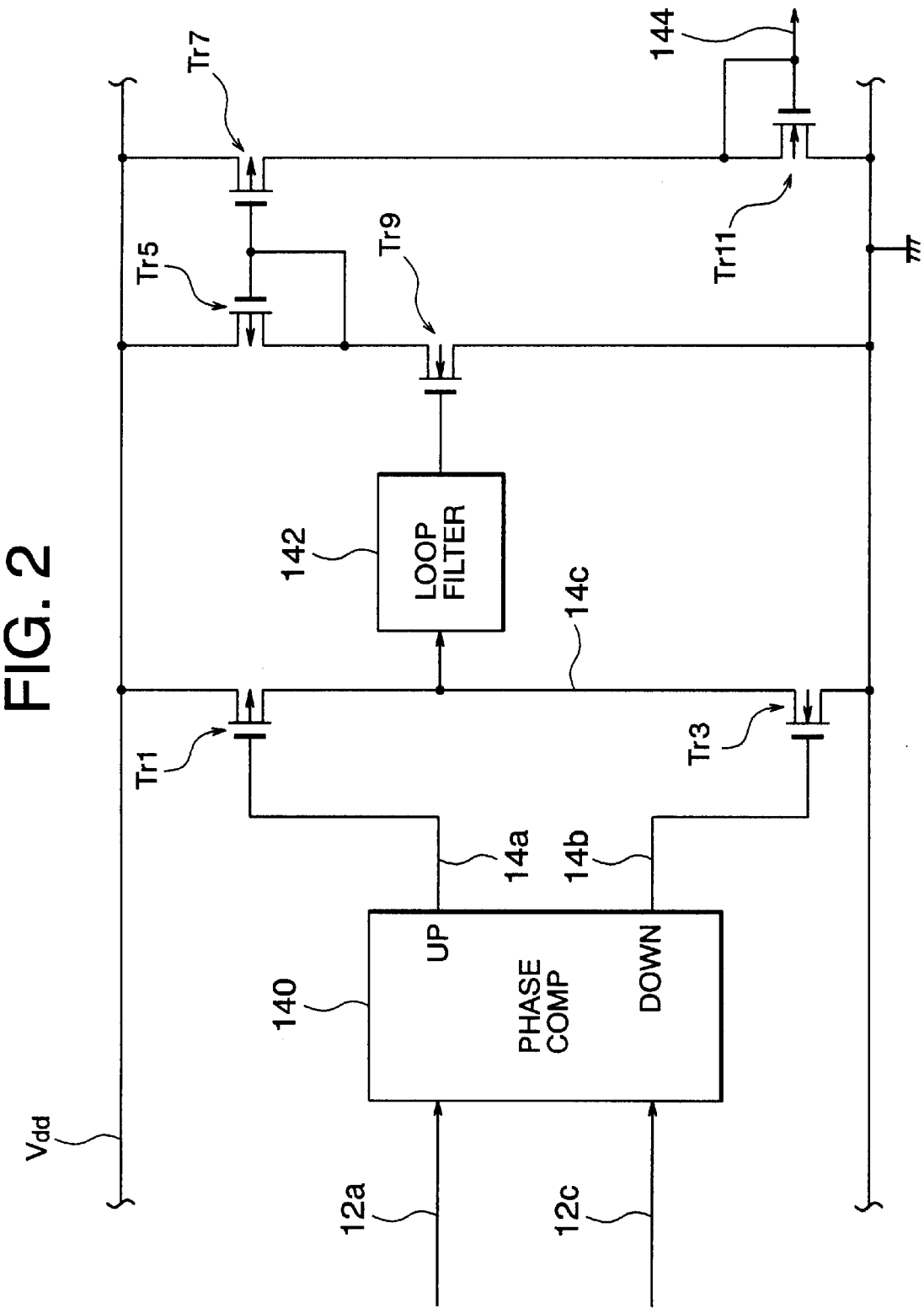
FIG. 2 is a circuit diagram of the frequency control circuit in FIG. 1.

Referring to FIG. 2, the frequency control circuit 14 comprises a phase comparator (COMP) 140, a loop filter 142, PMOS transistors Tr1, Tr5, Tr7, and NMOS transistors Tr3, Tr9, Tr11. The phase comparator 140 receives the VCO output signal 12a (VCO_OUT) and reference frequency clock 12c, and generates a frequency-up signal 14a and a frequency-down signal 14b. The frequency-up signal is supplied to the gate terminal of PMOS transistor Tr1. The frequency-down signal is supplied to the gate terminal of NMOS transistor Tr3.

The source of PMOS transistor Tr1 is connected to a power-supply line ($V_{dd}$). The source of NMOS transistor Tr3 is grounded. The drain terminals of PMOS transistor Tr1 and NMOS transistor Tr3 are mutually interconnected, and are also connected to the input terminal of the loop filter 142.

The loop filter 142 is a smoothing filter comprising, for example, a capacitor, which is sufficient for comparatively small currents, or a capacitor and a choke coil (an LC filter), which can handle comparatively larger currents. The output terminal of the loop filter 142 is coupled to the gate of NMOS transistor Tr9.

The drain and gate of PMOS transistor Tr5 and the gate of PMOS transistor Tr7 are connected in common to the drain of NMOS transistor Tr9. The drain of PMOS transistor Tr7 is coupled to the drain and gate of NMOS transistor Tr11. The sources of PMOS transistors Tr5, Tr7 are connected to the power-supply line ($V_{dd}$), and the sources of NMOS transistors Tr9, Tr11 are grounded. The drain signal of PMOS transistor Tr7 and NMOS transistor Tr11 is the frequency control signal 144 output to the VCO 12 and Gm-C filter 20.

Figure 3:
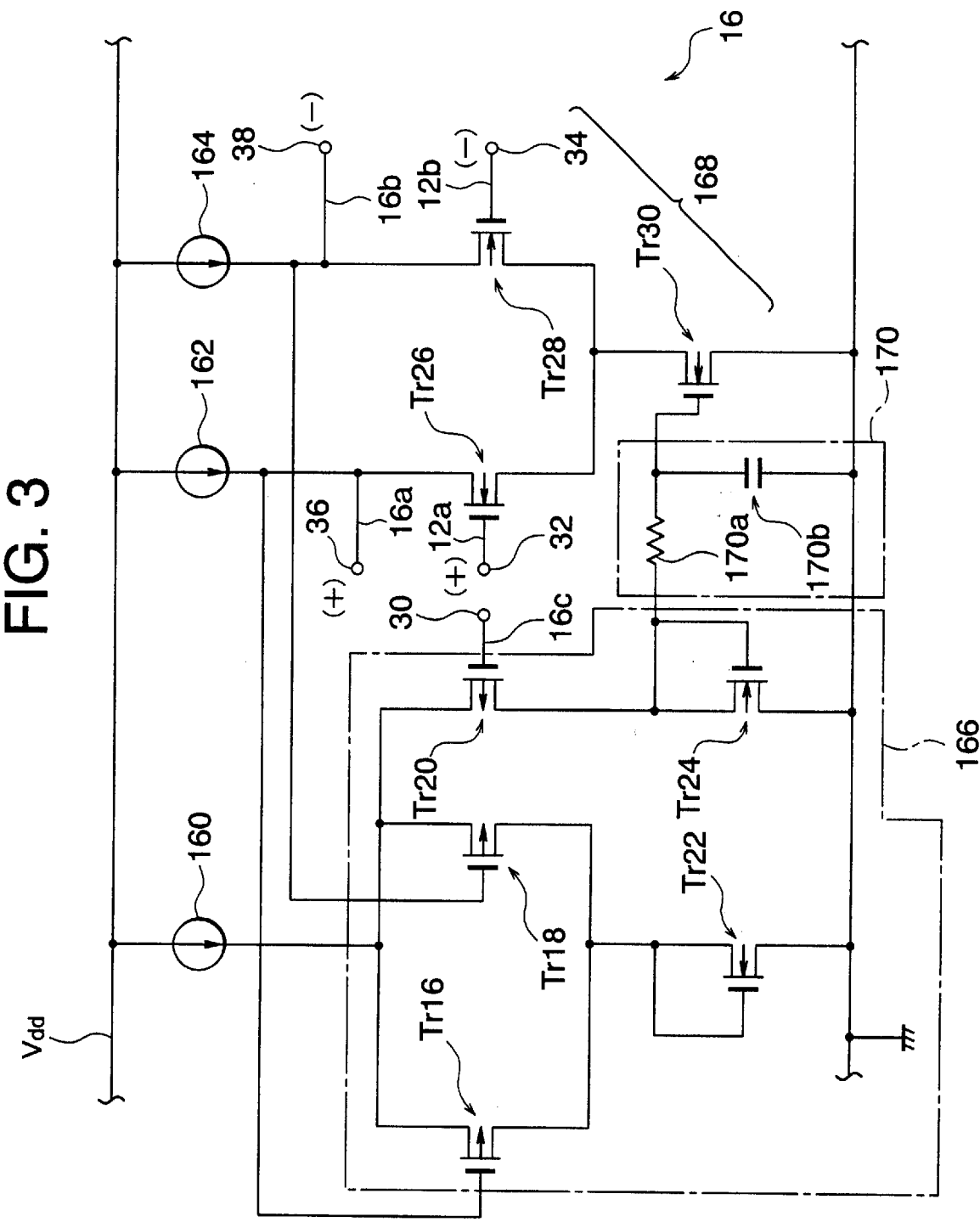
FIG. 3 is a circuit diagram of the amplitude control circuit in FIG. 1.

Referring to FIG. 3, the amplitude adjustment circuit 16 comprises three current sources 160, 162, 164, a voltage comparison circuit 166, an amplifying circuit 168, and a smoothing filter 170. The input terminals of all of the current sources 160, 162, 164 are connected to the power-supply line ($V_{dd}$).

The voltage comparison circuit 166 comprises PMOS transistors Tr16, Tr18, Tr20 and NMOS transistors Tr22, Tr24. The output terminal of current source 160 is connected to the sources of PMOS transistors Tr16, Tr18, Tr20. The output terminal of current source 162 is coupled to the gate of PMOS transistor Tr16. The output terminal of current source 164 is coupled to the gate of PMOS transistor Tr18. The drains of PMOS transistors Tr16 and Tr18 are mutually interconnected, and are also connected to the drain and gate of NMOS transistor Tr22. The drain of PMOS transistor Tr20 is connected to the drain and gate of NMOS transistor Tr24. The sources of the NMOS transistors Tr22, Tr24 are grounded.

The input to the voltage comparison circuit 166 is the reference voltage signal 16c ($V_{ref}$). This input signal is supplied from an input terminal 30 to the gate of PMOS transistor Tr20. The output of the voltage comparison circuit 166 is the drain signal of PMOS transistor Tr20 and NMOS transistor Tr24. This output signal is supplied to the smoothing filter 170.

The amplifying circuit 168 comprises NMOS transistors Tr26, Tr28, Tr30. The source of NMOS transistor Tr30 is grounded. The gate of NMOS transistor Tr30 receives the output of the smoothing filter 170. The drain of NMOS transistor Tr30 is coupled to the sources of NMOS transistors Tr26, Tr28. The gate of NMOS transistor Tr26 is coupled to the non-inverting input terminal 32 of the amplitude control circuit 16 and receives VCO output signal 12a (VCO_OUT). The gate of NMOS transistor Tr28 is coupled to the inverting input terminal 34 and receives VCO output signal 12b. The drain of NMOS transistor Tr26 is coupled to the output terminal of current source 162, and to the non-inverting output terminal 36 of the amplitude control circuit 16. The drain of NMOS transistor Tr28 is coupled to the output terminal of current source 164, and to the inverting output terminal 38 of the amplitude control circuit 16.

The smoothing filter 170 has a simple configuration comprising a resistor 170a and a capacitor 170b. The resistor 170a is connected at one end to the gate of NMOS transistor Tr24, and at the other end to the gate of NMOS transistor Tr30 and one side of the capacitor 170b. The other side of the capacitor 170b is grounded.

The amplifying circuit 168 amplifies the differential VCO output signals 12a, 12b. The amplified differential signals are output from the differential output terminals 36, 38 as the differential input signals 16a, 16b of the VCO 12, and are also supplied to the voltage comparison circuit 166. The voltage comparison circuit 166 compares the amplified differential signals with the voltage reference signal received at input terminal 30, and generates a comparison output voltage signal. The smoothing circuit 170 smoothes the comparison output voltage signal and generates a bias voltage that, applied to the gate of NMOS transistor Tr30, determines the gain of the amplifying circuit 168.

The amplitude adjustment circuit 16 also includes a common-mode feedback circuit (not visible) that controls current sources 162, 164 according to the amplified differential signals 16a, 16b. This common-mode feedback circuit holds the direct-current component of the amplified differential signals 16a, 16b at a constant voltage level exceeding the reference voltage ($V_{ref}$), thereby holding the average gate potentials of PMOS transistors Tr16, Tr18 constant at the same level exceeding $V_{ref}$.

Detailed descriptions of the internal structure of the Gm cells 120, 122 will be omitted. A conventional structure, such as the structure described in the article mentioned as background art, can be employed. The transconductance value (Gm) of the Gm cells 120, 122 varies according to the frequency control signal 144. Both Gm cells 120, 122 respond in the same way to the frequency control signal 144; that is, their transconductance values increase together or decrease together.

A detailed description of the internal structure of the Gm-C filter 20 will also be omitted. Various structures are possible. In one, the Gm-C filter 20 comprises a pair of Gm cells with respective load capacitors. The capacitances of the load capacitors may vary according to temperature and process conditions, but similar variations occur in the capacitors in the oscillating circuit 10, providing a form of temperature and process compensation. The frequency control signal 144 controls the transconductance of the Gm cells in the Gm-C filter 20 in the same way as it controls the transconductance of the Gm cells in the VCO 12, so when the VCO 12 is tuned to a desired frequency, the Gm-C filter 20 is similarly tuned.

The oscillating circuit 10 operates as follows.

The operation of the VCO 12 is described by the following equations (1), (2), in which G is the loop gain of the loop including the VCO 12 and amplitude control circuit 16, $A_a$ is the amplitude gain (determined by the amplitude control circuit 16), Gm is the transconductance value of the Gm cells 120, 122, C1 is the capacitance of capacitors 124a, 124b, 126a, 126b, $\omega$ is the angular frequency parameter of the VCO 12, and f is the oscillation frequency of the VCO 12.

$$G = \frac{A_a}{1 + \frac{Gm}{Gm} + \frac{C1}{C1} + j\left(\frac{\omega C1}{Gm} - \frac{Gm}{\omega C1}\right)} \quad (1)$$

$$f = \frac{1}{2\pi\sqrt{\frac{1}{Gm} \cdot \frac{1}{Gm} \cdot C1 \cdot C1}} \quad (2)$$

$$= \frac{1}{2\pi\sqrt{\frac{C1^2}{Gm^2}}}$$

$$= \frac{Gm}{2\pi C1}$$

The gain $G_T$ over one oscillation period has the simpler expression given in equation (3).

$$G_T = \frac{A_a}{1 + \frac{Gm}{Gm} + \frac{C1}{C1}} = \frac{A_a}{3} \quad (3)$$

In the frequency control circuit 14, the phase comparator 144 compares the phase of the VCO output signal 12a (VCO_OUT) with the phase of the reference clock signal 12c. If the VCO output signal 12a lags the reference clock 12c, the phase comparator 140 activates the frequency-up signal 14a. If the VCO output signal 12a leads the reference clock 12c, the output voltage activates the frequency-down signal 14b. The output voltage of the frequency-up signal 14a or frequency-down signal 14b is proportional to the phase difference between the VCO output signal 12a and the reference clock signal 12c.

The frequency-up signal 14a and frequency-down signal 14b control transistors Tr1 and Tr3. The drain signal 14c of these two transistors is thus responsive to the changing phase difference between the VCO output signal 12a and the reference clock signal 12c. The loop filter 142 smoothes this signal 14c and supplies it to the gate of NMOS transistor Tr9, which regulates current flow through PMOS transistor Tr5. A proportional current flows through PMOS transistor Tr7, generating a voltage at the drain and gate of NMOS transistor Tr11. This voltage is the frequency control signal 144. The frequency signal 144 thus varies in response to the smoothed result of the phase comparison performed in the phase comparator 140.

The frequency control signal 144 is supplied to Gm cells 120 and 122 as shown in FIG. 1, and controls their transconductance values (Gm). The frequency control signal 144 accordingly controls the oscillation frequency f of the VCO 12, as indicated by equation (2) above. The VCO 12 and frequency control circuit 14 thus operate as a PLL to move the frequency f of the VCO 12 toward the frequency ($f_{ref}$) of the reference clock signal 12c. Through repetitions of this feedback control operation, the output of the VCO 12 becomes locked in frequency and phase with the reference clock signal 12c.

The frequency f in equation (2) also depends on the capacitance C1 of capacitors 124a, 124b, 126a, 126b, but even if these capacitors deviate from their design values due to the ambient temperature or to fabrication process variations, the frequency control circuit 14 adjusts the Gm values to bring the VCO output frequency f to the reference clock frequency $f_{ref}$. Accordingly, the VCO output frequency does not depend on temperature or process conditions.

As indicated by equation (2), the frequency f does not depend on the amplitude gain $A_a$ set by the amplitude control circuit 16. Frequency control is therefore stable regardless of how the amplitude of the VCO output is controlled.

The amplitude of the VCO output is controlled by the loop including the VCO 12 and amplitude control circuit 16. The amplitude of the VCO output increases when the loop gain G is greater than unity, decreases when the loop gain G is less than unity, and remains constant when the loop gain is equal to unity. From this and equation (3) above, it follows that the VCO output will diverge (if $A_a>3$), converge (if $A_a<3$), or oscillate (if $A_a=3$).

Figure 4:
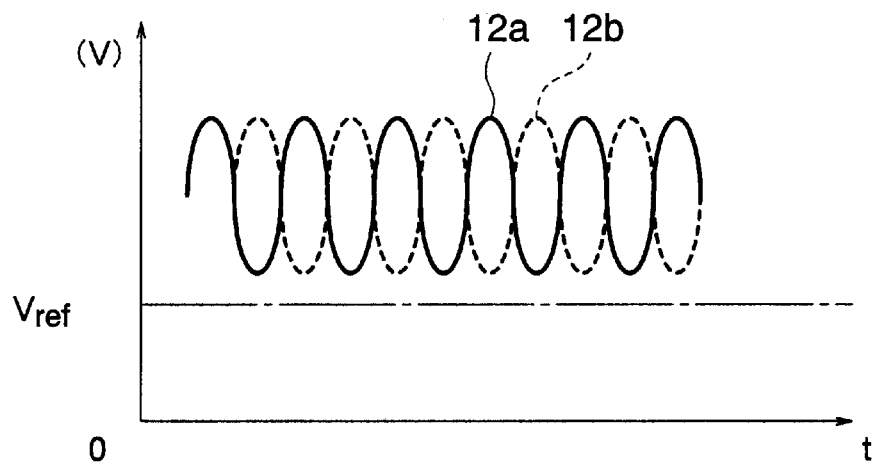
FIG. 4 is a waveform diagram illustrating oscillation of the VCO in FIG. 1 with a comparatively small amplitude.
Figure 5:
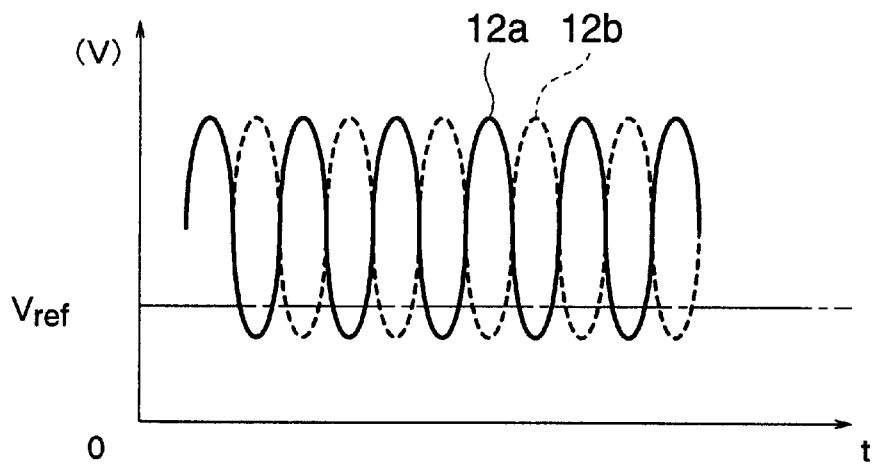
FIG. 5 is a waveform diagram illustrating oscillation of the VCO in FIG. 1 with a larger amplitude.

FIGS. 4 and 5 show two examples of the oscillating case ($A_a$ close to 3). Both drawings show waveforms of the differential outputs 12a, 12b of the VCO 12, the vertical axis indicating voltage (V) and the horizontal axis indicating time (t).

FIG. 4 shows a case in which the amplitude of the oscillation is relatively small. Since the oscillation at the input terminals 32, 34 of the amplitude control circuit 16 in FIG. 3 is small, the oscillation of the gate potential levels of PMOS transistors Tr16, Tr18 in the voltage comparison circuit 166 is also small, and these gate potential levels (not shown in FIG. 4) remain higher than the reference voltage ($V_{ref}$) supplied to the gate of PMOS transistor Tr20. PMOS transistors Tr16, Tr18 thus conduct less current than PMOS transistor Tr20, so comparatively more of the current generated by current source 160 flows through NMOS transistor Tr24, increasing the drain voltage of this transistor and thus the gate bias voltage of transistor Tr30 in the amplifying circuit 168. The gain of the amplifying circuit 168 therefore rises ($A_a>3$), causing the amplitude of the VCO output to increase.

FIG. 5 shows the reverse case, in which the amplitude of the oscillation of the VCO output signals 12a, 12b is comparatively large. Consequently, the oscillation of the gate potentials of PMOS transistors Tr16, Tr18 in FIG. 3 is comparatively large, and these gate potentials reach levels below the reference voltage ($V_{ref}$) supplied to the gate electrode of PMOS transistor Tr20. Even though their average gate potentials remain constant, PMOS transistors Tr16, Tr18 now conduct more current than PMOS transistor Tr20, so comparatively less current flows through NMOS transistor Tr24, reducing the drain voltage of this transistor, the gate bias voltage of transistor Tr30, and the gain of the amplifying circuit 168 ($A_a<3$), thereby causing the amplitude of the VCO output to decrease.

As a result of these operations, the amplitude control circuit 16 holds the output amplitude of the VCO 12 steady at a value such that the amplitude gain $A_a$ is equal to three. This value depends only on the reference voltage ($V_{ref}$), and not on the transconductance values of the Gm cells 120, 122 in the VCO 12. Consequently, amplitude control by the amplitude control circuit 16 neither affects nor is affected by frequency control by the frequency control circuit 14. This is one advantage of the invented amplitude control scheme.

Another advantage is that the invented amplitude control scheme does not involve control of the power supplies of the Gm cells 120, 122. The oscillating circuit 10 thus avoids excess power consumption during amplitude adjustment.

Yet another advantage is that the voltage comparison circuit 166 does not have to detect either the instantaneous amplitude or the peak-to-peak amplitude of the VOC output signal 12a. The voltage comparison circuit 166 only has to detect one amplitude limit of the VOC output signal 12a; that is, either the upper envelope or the lower envelope of the VOC output signal 12a. In FIGS. 4 and 5, since the average level of the VOC output signal 12a varies with the lower envelope, while the upper envelope remains constant, the voltage comparison circuit 166 detects the lower envelope as an amplitude limit.

A further advantage is that the VOC output signal 12a does not have to be rectified in order for its amplitude limit to be detected.

Figure 6:
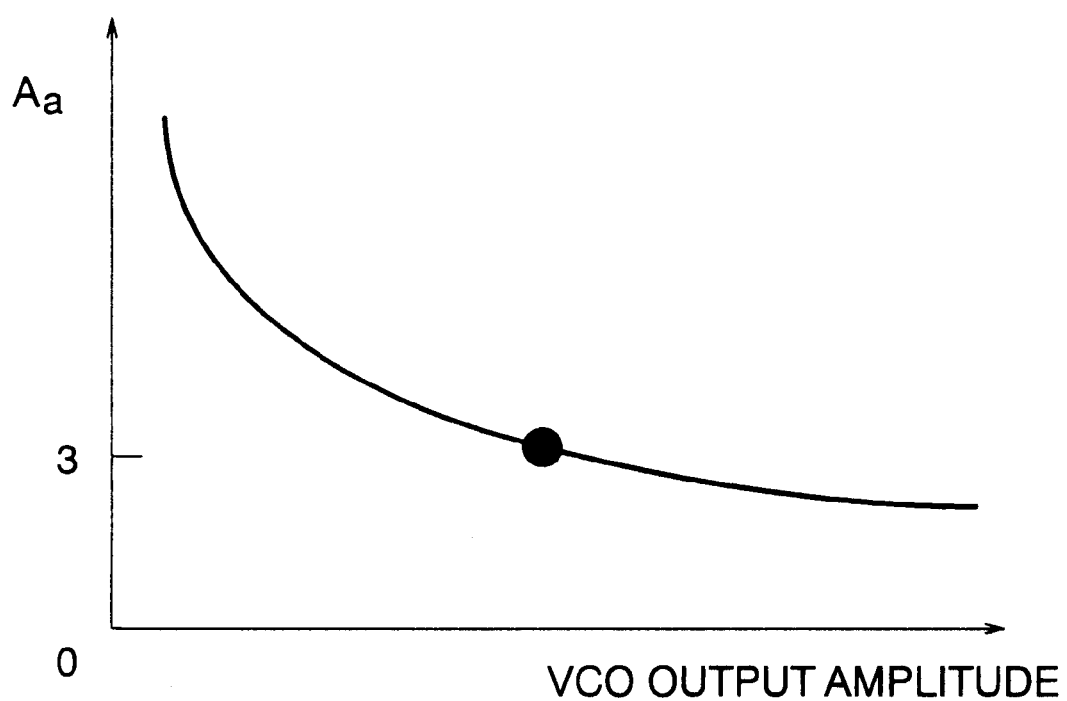
FIG. 6 is a graph illustrating the amplitude operating characteristic of the VCO and amplitude control circuit in FIG. 1.

FIG. 6 illustrates the relationship between the amplitude gain $A_a$ determined by the amplitude control circuit 16, shown on the vertical axis, and the output amplitude of the VCO 12, shown on the horizontal axis. The operating point of the oscillating circuit 10 is the point marked with the dot ($A_a=3$).

As explained above, the cutoff frequency of the Gm-C filter 20 is controlled by the frequency control signal 144. Since the PLL feedback loop including the frequency control circuit 14 is unaffected by the amplitude gain of the amplitude control circuit 16, amplitude control of the VCO 12 does not affect the cutoff frequency of the Gm-C filter 20. As also explained above, the cutoff frequency of the Gm-C filter 20 is automatically compensated for temperature variations and fabrication process variations.

The invention thus provides a tuning circuit 10 in which frequency tuning (f-tuning) and amplitude tuning (equivalent to Q-tuning) are independent of one another, so that the feedback control loops for these two parameters remain stable under all combinations of the two parameter values. Furthermore, the Gm-C filter 20 can be easily structured in such a way as to provide automatic compensation for temperature and fabrication-process variations.

In the oscillating circuit 10 described above, the four capacitors 124a, 124b, 126a, 126b in the VCO 12 were assumed to have identical capacitance values, but this is not a necessary condition. Operation of the oscillating circuit 10 will remain stable even if these capacitance values are not all the same.

The operating point of the VCO 12 and amplitude control circuit 16 is not limited to the point ($A_a=3$) shown in FIG. 6.

The Gm cells are not limited to the differential type, but may be transconductance amplifiers of the single-ended type.

Those skilled in the art will recognize that further variations are possible within the scope claimed below.

What is claimed is:

1. A tuning circuit comprising:
    an oscillator receiving an oscillating input signal and a control signal and generating an oscillating output signal, having a transconductance element with a variable transconductance value controlled by the control signal, the oscillating output signal having an amplitude responsive to the oscillating input signal and a frequency responsive to the variable transconductance value;
    a frequency control circuit coupled to the oscillator, receiving a reference signal, detecting a phase difference between the oscillating output signal and the reference signal, thereby generating the control signal; and
    an amplitude control circuit coupled to the oscillator, detecting an amplitude limit of the oscillating output signal, generating the oscillating input signal according to the detected amplitude limit.

2. The tuning circuit of claim 1, wherein the amplitude control circuit includes a voltage comparator that compares said amplitude limit with a reference voltage, the oscillating input signal being generated according to a difference between the amplitude limit and the reference voltage.

3. The tuning circuit of claim 2, wherein the amplitude control circuit includes an internal amplifying circuit that generates the oscillating input signal by amplifying the oscillating output signal, the internal amplifying circuit having a gain that varies responsive to said difference.

4. The tuning circuit of claim 1, wherein the oscillator comprises:
    a pair of transconductance amplifiers functioning as said transconductance element; and
    a pair of capacitors coupled to respective transconductance amplifiers.

5. The tuning circuit of claim 4, wherein:
    a first one of said transconductance amplifiers receives the oscillating input signal;
    a second one of said transconductance amplifiers generates the oscillating output signal;
    a first one of said capacitors is coupled in series between the first one of said transconductance amplifiers and the second one of said transconductance amplifiers;
    a second one of said capacitors has a first terminal coupled to the first one of said capacitors at a point between the first one of said transconductance amplifiers and the second one of said transconductance amplifiers, and a second terminal coupled to ground; and
    the second one of said transconductance amplifiers receives an internal input signal from the first one of said transconductance amplifiers through the first one of said capacitors.

6. The tuning circuit of claim 1, further comprising a filter having a filter characteristic controlled by the control signal output by the frequency control circuit.

7. The tuning circuit of claim 6, wherein the filter includes a filter transconductance element having a variable transconductance value controlled by the control signal.

* * * * *